United States Patent [19]

Schwartz

[11] 4,246,645

[45] Jan. 20, 1981

[54] PASSIVE ANNIHILATOR

[75] Inventor: Sidney J. Schwartz, Vista, Calif.

[73] Assignee: Burroughs Corporation, Detroit, Mich.

[21] Appl. No.: 40,876

[22] Filed: May 21, 1979

[51] Int. Cl.³ ............................................. G11C 19/08
[52] U.S. Cl. .......................................... 365/1; 365/43
[58] Field of Search ...................................... 365/1, 43

[56] References Cited
U.S. PATENT DOCUMENTS

| 3,713,117 | 1/1973 | Bobeck | 365/43 |
| 3,729,726 | 4/1973 | Bobeck | 365/43 |

Primary Examiner—James W. Moffitt

Attorney, Agent, or Firm—Joseph R. Dwyer; Charles J. Fassbender; Kevin R. Peterson

[57] ABSTRACT

A passive annihilator comprising an annihilator element in the form of a spiral located at the end of a path of propagate elements whereby bubbles, entering the spiral element in response to the rotating in-plane magnetic field, will follow the spiral path to its center, and any subsequent bubbles, in a stream of bubbles, entering the spiral will help hold the prior bubble captive in the spiral. The final bubble in a bubble stream under high magnetic bias conditions will be annihilated near the spiral center while the final bubble under low magnetic bias conditions will circulate in response to the in-plane rotating field indefinitely in the spiral, but is not free to escape, and will be annihilated by the entry of new bubbles from a subsequent bubble stream.

8 Claims, 24 Drawing Figures

PASSIVE ANNIHILATOR

BACKGROUND OF THE INVENTION

This invention is directed to magnetic bubble (domain) devices and, more particularly, to a new and improved passive annhilator for bubble memory chips.

Magnetic bubble domain devices (chips) are now well-known in the art. These chips have means for forming and supporting bubbles under a suitable bias field and for propagating bubbles on patterns of propagate elments serially, as a stream, in response to an in-plane rotating magnetic field. The use of gating devices which transfer bubbles from one path to another path in response to a current applied to a control gate conductor associated with the gate is also old.

In the bubble memory storage area, identical closed storage loops are formed of a selected type of propagate elements and are connected by suitable input tracks of propagate elements from a bubble generator and an output track of propagate elements to a bubble detector which senses the presence or absence of a bubble in the detector and sends an appropriate signal to a utilization device. The presence or absence of a bubble on the individual propagate elements represents information stored in memory and read out by the detector. A bubble transferred into a storage loop will circulate indefinitely in response to the rotating in-plane magnetic field unless transferred out and, a suitable bias source, control circuits, etc. for the application of pulse to the functional elements mentioned above such as transfer-in and transfer-out gates are, of course, well-known.

Also well-known are transfer-in and transfer-out gates and decoding gates for decoding information to be sent to the storage loops on the bubble memory chip. Too, bubble memory chips are conventionally provided with annihilators to rid the system of unwanted bubbles. These annihilators are either of an active type which requires a current conductor line associated therewith to be pulsed to annihilate the bubble, or of a passive type, which does not have a conductor associated therewith. Also, the annihilator may be a guard rail located so that unwanted bubbles will be confined therein and eventually destroyed. A typical example of a passive annihilator is shown in FIG. 1 where a rectangular element 10 of permalloy material (like the propagate elements 12 connected thereto) with a protrusion 14 arranged in the path of bubble propagation such that a bubble moving along the path to the annihilator element 10 is attracted to the protrusion 14 and carried off onto the rectangle 10 where it will continue to rotate about the periphery of the rectangle. As an additional new bubble reaches the rectangle, the one rotating thereon, would be collapsed. However, at a low magnetic bias field this type of annihilator element generally results in bubbles being transferred (kicked) off the annihilator element during the cycle after a new bubble has entered onto the rectangle 10. Thus, the prior art passive annihilator is not reliable at low bias field conditions and it is a primary object of this invention to provide a passive annihilator in which bubbles do not escape the annihilator whether under low or high bias field conditions.

SUMMARY OF THE INVENTION

The passive annihilator which meets the foregoing primary object comprises an annihilator element in the form of a spiral located at the end of a propagation path and formed of the same material as the propagate elements. Bubbles, entering the spiral element in response to the rotating in-plane magnetic field, will follow the spiral path to its center and subsequent bubbles in a series of bubbles entering the spiral will aid in holding the prior bubbles captive in the spiral. The final bubble in the stream under high magnetic bias conditions will be annihilated near the spiral center while the final bubble in the stream under low magnetic bias conditions will circulate indefinitely in the spiral in response to the rotating in-plane field, but is not free to escape and will be annihilated when bubbles from a subsequent stream enter the spiral.

BRIEF DESCRIPTION OF THE PREFERRED EMBODIMENT

Figure 1:
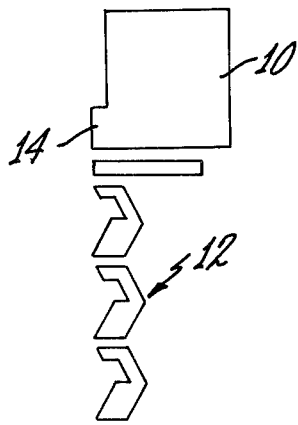
FIG. 1 illustrates a prior art rectangular type annihilator element.

FIG. 1, the prior art passive annihilator, as mentioned above, comprises a rectangle 10 of permalloy material located at the end of a bubble path of propagate elements 12 in which a bubble will circulate on the outer edges of the rectangle. Bubbles are attracted thereto by a small protrusion 14 arranged in the bubble propagation path and, as bubbles are propagated by the rotating in-plane magnetic field, they are individually attracted to the protrusion 14 and are carried off onto the rectangle. One bubble will continue to rotate indefinitely until a subsequent bubble is attracted onto the protrusion 14 and the new bubble will cause the preceding bubble to be annihilated. As mentioned also above, one of the problems with this type of annihilator is that there is a tendency, particularly at low bias field conditions, to have the bubble be kicked off the element by the subsequent bubble after it has entered the annihilator.

Figure 2:
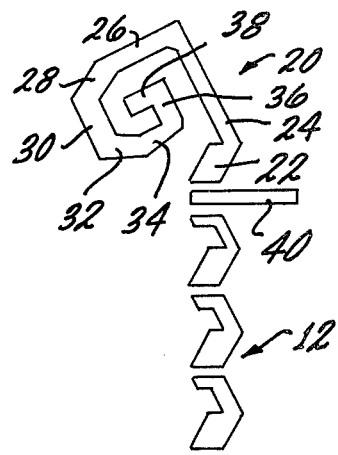
FIG. 2 illustrates the spiral annihilator element formed in accordance with the teachings of the present invention.

The annihilator of the present invention is in the form of a spiral element 20 located at the end of a bubble path of asymmetrical chevron propagate elements 12 and is illustrated first in FIG. 2.

It is understood, before going further, that both FIGS. 1 and 2 and all subsequent figures illustrate a portion of a magnetic chip but all details are omitted for clarity. Too, while the spiral is shown as segmented with discrete corners, the spiral could be a smooth continuous curved structure with a decreasing radius of curvature. The segmented spiral is easier to plot on automatic mask making devices and the discrete points also aid in describing bubble positions herein. Thus, as shown, the spiral comprises a first portion 22 which corresponds to about one half of an asymmetrical element, positioned in the same manner as the chevron elements of the bubble path, with a segment 24, extending in the same direction as the similarly located segment on the chevron elements but of greater length, and connected to a second segment 26 located at an angle of about 90° thereto. Connected to segment 26 is a short segment 28 located about 30° to the segment 26 from which extends a fourth segment 30 which parallels segment 24 but is shorter. Also, segment 30 is connected by segment 32 disposed at an angle of about 60° to segment 34 which parallels segment 26 but is shorter. Finally, the spiral is provided with a segment 36 which parallels the segment 24 but is shorter and terminates in a final segment 38 parallel to segment 26. Segment 38 is the inner termination of the spiral. Also provided in the bubble path and forming a part thereof is a pulloff bar 40 which functions to make the transfer of the bubbles to the annihilator element easier. This corresponds to a similarly located bar in the prior art annihilator of FIG. 1.

Figure 3:
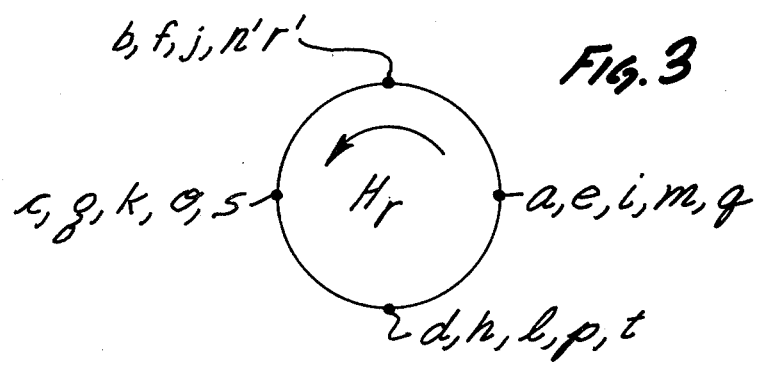
FIGS. 3 and 3a-t illustrate the operation of the annihilator in a series of bubbles.
Figure 3A:
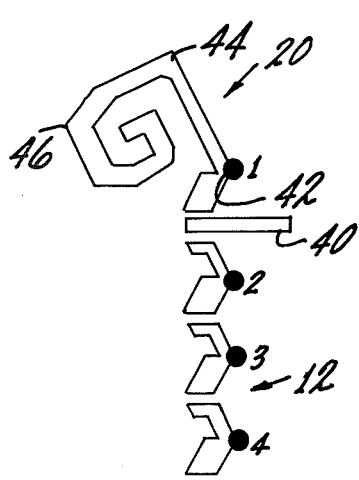
Figure 3B:
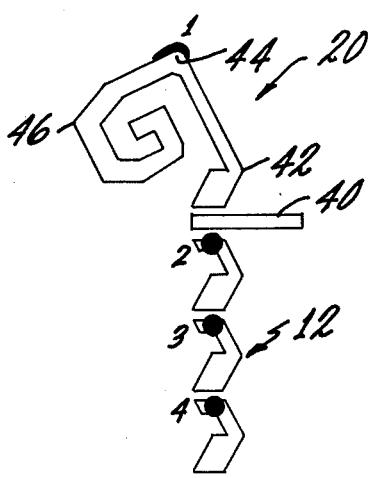
Figure 3C:
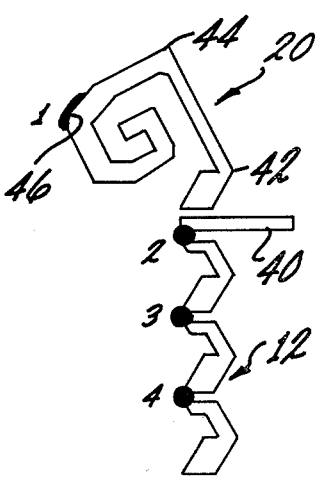
Figure 3D:
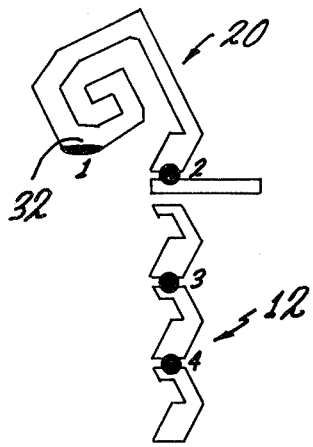
Figure 3E:
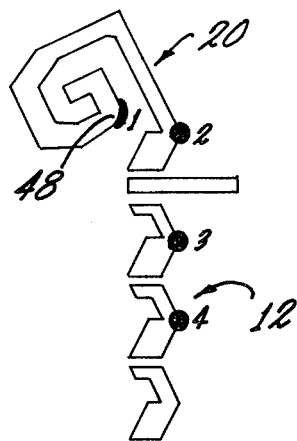
Figure 3F:
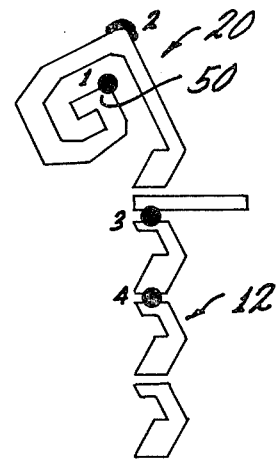
Figure 3G:
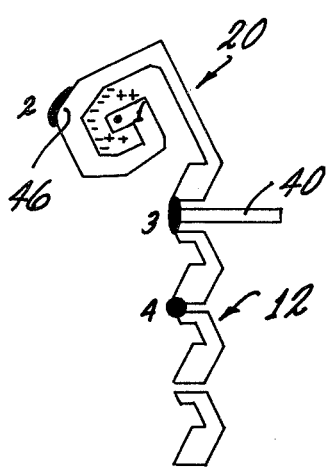
Figure 3H:
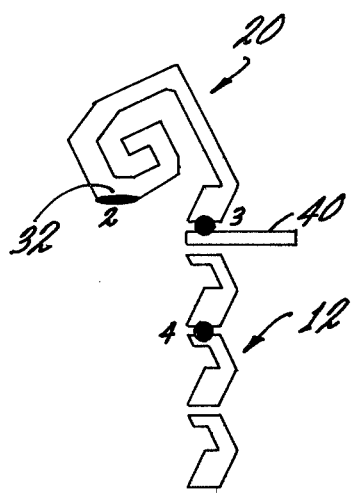
Figure 3I:
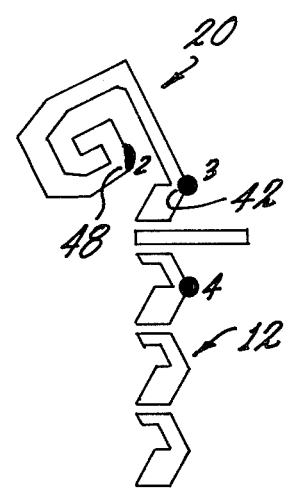
Figure 3J:
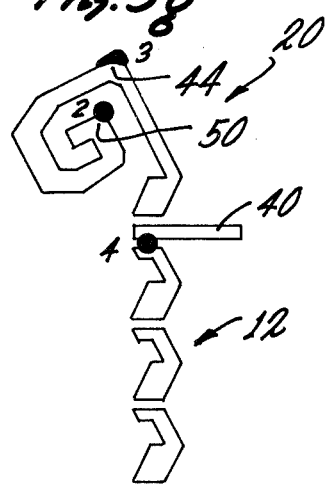
Figure 3K:
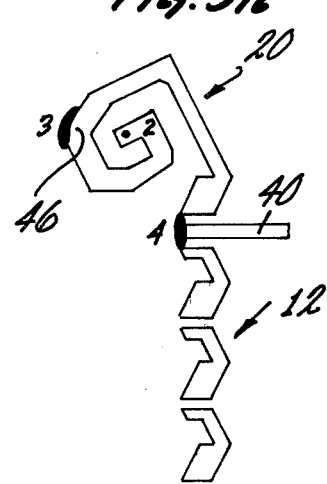
Figure 3L:
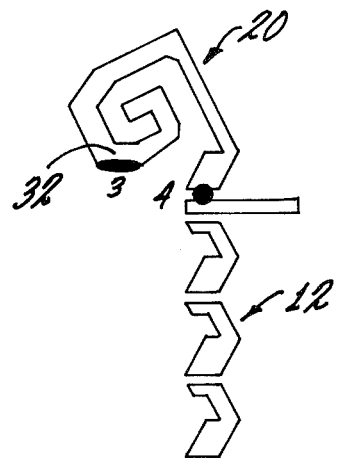
Figure 3M:
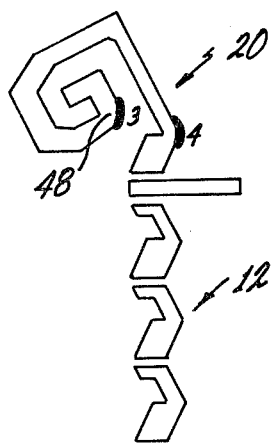
Figure 3N:
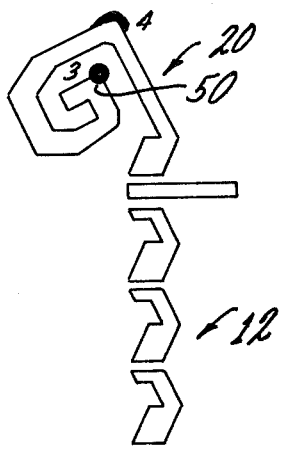
Figure 3O:
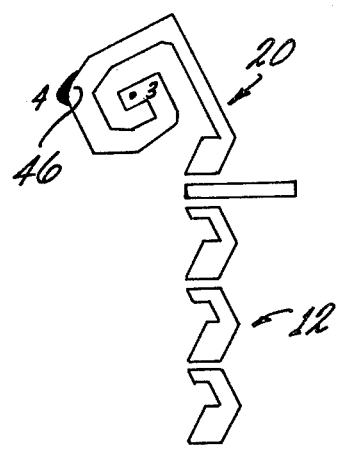
Figure 3P:
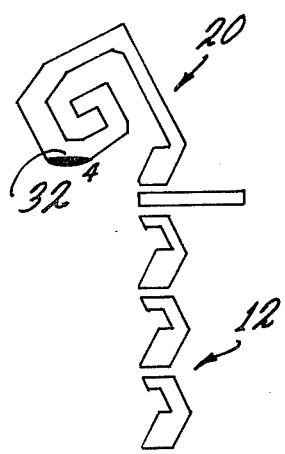
Figure 3Q:
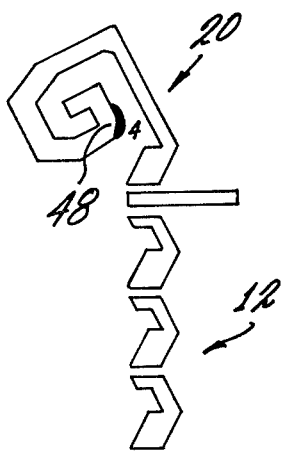
Figure 3R:
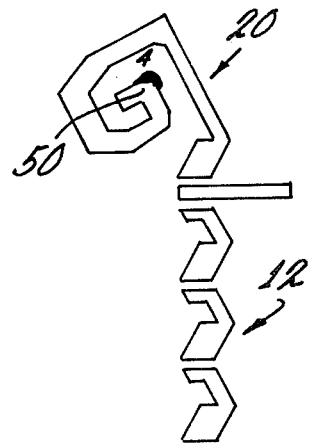
Figure 3S:
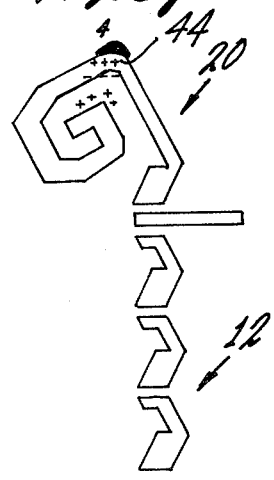
Figure 3S:
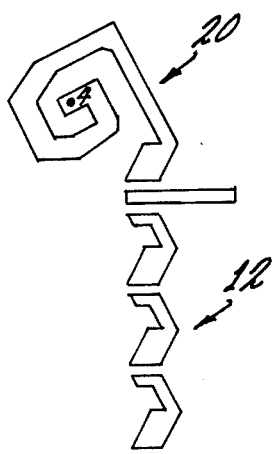
Figure 3T:
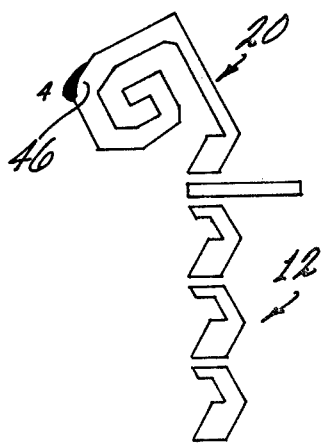

In order to understand the operation of this annihilator, attention is now directed to FIGS. 3a–t, which taken together with a vector diagram of the rotating in-plane magnetic field $H_r$, correlates phases of the in-plane magnetic field with bubble positions as illustrated in these figures. Four different vector positions illustrate the operation of the annihilator with four bubbles numbered 1, 2, 3 and 4, illustrated by way of example. Also, as used herein low bias conditions means operating the chip at a magnetic bias field toward bubble strip out condition while high bias conditions means operating the chip at a magnetic bias field toward bubble collapse conditions.

FIG. 3a shows three of the four bubbles at the apices on the asymmetrical chevron elements and one bubble, bubble 1, already on the annihilator element itself at point 42 due to the direction of the in-plane magnetic field. FIG. 3b is a quarter of a cycle later with bubbles 2, 3 and 4 at the top leg of the chevron elements 12 while bubble number 1 is striping out at the top corner 44 of the annihilator element.

FIG. 3c shows bubbles 2, 3 and 4 propagating along the track, i.e., bubble 2 is on the pulloff bar 40 and bubbles 3 and 4 are between elements, while bubble number 1 is at the left hand corner 46 of the annihilator element still in its striped out condition.

FIG. 3d shows bubble 2 as having entered the annihilator element and bubble 1, at the lowermost position, i.e., on segment 32, of the annihilator element with bubbles 3 and 4 having propagated one step closer to the annihilator.

FIG. 3e shows bubble 1 on the inner portion of the annihilator, i.e., at corner 48, shown blunted or chamfered, as compared to corners 42, 44 and 46, and bubble 2 at corner 42; the same position as bubble number 1 assumed in FIG. 3a. Likewise, bubbles 3 and 4 have assumed a position on the apices of the chevron elements 12. Note, that bubble 1 is close now to bubble 2.

FIG. 3f shows bubble 1 at the inner apex corner 50 of the spiral, bubble 2 at the very top corner 44 of the spiral and striping out and bubbles 3 and 4 beginning to cross the gap between the propagate elements. Bubble 1 is now subject to shrinking due to unfavorable poles around it and bubble 2, at point 44, prevents bubble 1 from jumping to point 44, even at a low bias condition.

FIG. 3g shows bubble 1 disappearing by reason of the polarity of the magnetic fields within the spiral, i.e., the attractive magnetic pole is weak at segment 38 and a strong negative field exists on segments 28, 30 and 32. This is represented by the larger number of minus signs as compared to the number of plus signs. Bubble 2 is at the left hand corner 46 of the annihilator element; the same position that bubble number 1 was in, as shown in FIG. 3c. Bubble 3 is on bar 40 and bubble 4 is crossing the gap between adjacent elements 12. Thus, bubble 1 was shrunk and prevented from jumping to the outside of the spiral by bubble 2 already at point 46, even at a low bias condition.

FIG. 3h shows bubble 1 having completely disappeared and bubble 2 still in its striped out position at the lower most segment 32. Bubble 3 has entered the annihilator element while bubble 4 is on the last propagate element prior to the pulloff bar 40.

FIGS. 3i–k show the sequence of bubbles 2, 3 and 4 being propagated by the in-plane rotating magnetic field with FIG. 3k showing bubble 2 shrinking due to the polarities of the field in the same manner as bubble 1. In FIG. 3l, bubble 2 has completely disappeared and bubble 4 has entered the annihilator element.

FIGS. 3m, n and o follow in sequence like the prior figures with bubble 3 shrinking due to the polarities of the magnetic field in the same manner as bubbles 1 and 2 as shown in the previously described figures. Note that, bubble 3 cannot escape, even at low bias, because bubble 4 is located respectively, at corners 44 and 46 as in FIG. 3n and o.

FIGS. 3p, q and r show bubble 4 propagating around the annihilator element as the prior bubbles did, and FIG. 3r bubble 4 is shown having reached the inner apex corner 50.

Note, in FIG. 3p, only the bubble 4 remains and shown in this Figure at the bottom segment 32 and upon the rotation of the in-plane magnetic field continues around to point 50 in FIG. 3r where it is starting to shrink. However, since there is no other bubble sitting on the outside of the annihilator element directly above bubble 4, two things can happen. First, when the chip is operating at low bias and the bubble is on the verge of being annihilated inside the spiral as at point 50, the bubble pops to the outer segment at point 44 where it is trapped, although striped out, by favorable poles along the outer edge. This is illustrated in FIG. 3s with the favorable poles being represented by the plus signs near both points 44 and 50. For the case of the low bias, bubble 4 will continue around and appear in the left side of the spiral at point 46 as in FIG. 3t and repeats its travel to point 50 every cycle. On the other hand, in the case of a high bias condition, the second thing that happens is that bubble 4 will collapse inside the spiral which is illustrated in FIG. 3s'.

From the foregoing it can be seen that the spiral element is a reliable bubble annihilator. Experience has shown that as long as a spiral is completed for slightly more than one turn represented by points 42 and 48 and slightly beyond, or stated another way, a little more than 360° of bubble travel at a decreasing radius of curvature after entering the spiral, reliability exists for both low and high bias conditions. The thickness of the permalloy need only be enough to attract a bubble, and the width of the permalloy is not critcal. The width can be in the order of one bubble diameter to several times a bubble diameter, but if the width is too small to trap a bubble, i.e., considerably less than one bubble diameter, then the annihilator could fail at low bias.

What is claimed is:

1. A passive annihilator on a magnetic bubble domain propagation structure which includes means capable of supporting magnetic bubble domains thereon in response to a selected magnetic bias and which has propagate elements on which bubbles propagate element-to-element in response to a rotating in-plane magnetic field, said propagation elements defining at least one bubble flow path, an annihilator element of the same material as said propagate elements and located relative to said flow path to receive bubbles therefrom, said annihilator being in the form of a spiral in which one or more bubbles flow in a spiral path and are annihilated in said spiral.

2. The passive annihilator as claimed in claim 1, wherein said spiral is a continuous element defining said spiral for supporting bubble travel more than 360°.

3. The passive annihilator as claimed in claim 1, wherein said spiral comprises six segments of decreasing lengths to define said spiral and capable of holding a plurality of bubbles in series thereon, subsequent bubbles in said series interacting with said segments to hold preceding bubbles on said spiral and to prevent preceding bubbles from transferring out of said spiral until annihilated.

4. The passive annihilator as claimed in claim 1, wherein said spiral has means for receiving a plurality of bubbles which interact magnetically with said spiral and said rotating in-plane magnetic field and travel in a path of decreasing radius of curvature and wherein, those bubbles entering said spiral first are influenced by later bubbles to cause the prior bubbles to disappear as said subsequent bubbles continue their travel around said spiral.

5. The passive annihilator as claimed in claim 1, wherein a final bubble of a series of bubbles in said spiral will either disappear, or remain captive in said spiral and continually circulate in said spiral until additional bubbles enter said spiral whereupon said final bubble will dissapear.

6. A passive annihilator on a magnetic bubble domain propagation structure which includes means capable of supporting magnetic bubble domains thereon in response to a selected magnetic bias and which has propagate elements on which bubbles propagate element-to-element in response to a rotating in-plane magnetic field, said propagate elements defining at least one bubble flow path, an annihilator element of the same material as said propagate elements and located relative to said flow path to receive bubbles therefrom, said annihilator being in the form of a spiral, and comprising segments capable of holding a plurality of bubbles which serially propagate in a spiral path thereon, any subsequent bubble in said series interacting with said segments to hold any preceding bubble on said spiral until annihilated therein.

7. The passive annihilator as claimed in claim 6, wherein said segments define a path of travel for said bubbles of more than 360° after entering said spiral.

8. The passive annihilator as claimed in claim 7, wherein a final bubble of a series of bubbles in said spiral will either disappear, or remain captive in said spiral and continually circulate in said spiral until at least one additional bubble enters said spiral whereupon said final bubble will disappear, depending upon the selected bias applied to said propagation structure.

* * * * *